(12) United States Patent
Chand Sk

(10) Patent No.: US 8,693,264 B2
(45) Date of Patent: Apr. 8, 2014

(54) MEMORY DEVICE HAVING SENSING CIRCUITRY WITH AUTOMATIC LATCHING OF SENSE AMPLIFIER OUTPUT NODE

(75) Inventor: Md Rahim Chand Sk, Bangalore (IN)

(73) Assignee: LSI Corporation, San Jose, CA (US)

( * ) Notice: Subject to any disclaimer, the term of this patent is extended or adjusted under 35 U.S.C. 154(b) by 93 days.

(21) Appl. No.: 13/400,864

(22) Filed: Feb. 21, 2012

(65) Prior Publication Data

US 2013/0215685 A1    Aug. 22, 2013

(51) Int. Cl.
*G11C 16/04*        (2006.01)

(52) U.S. Cl.
USPC .................. 365/189.05; 365/205; 365/207

(58) Field of Classification Search
USPC ............... 365/189.05, 205, 207, 190, 191
See application file for complete search history.

(56) References Cited

U.S. PATENT DOCUMENTS

| | | | |
|---|---|---|---|
| 5,007,024 A | 4/1991 | Tanaka et al. | |
| 5,023,841 A | 6/1991 | Akrout et al. | |
| 5,710,742 A | 1/1998 | Carter et al. | |
| 5,903,171 A | 5/1999 | Shieh | |
| 6,201,418 B1 | 3/2001 | Allmon | |
| 6,462,998 B1 | 10/2002 | Proebsting | |
| 6,535,026 B2 | 3/2003 | Chung et al. | |
| 6,631,090 B1 | 10/2003 | Kwak et al. | |
| 7,477,560 B2 * | 1/2009 | Kawasumi | 365/207 |
| 7,626,877 B2 * | 12/2009 | Kim et al. | 365/205 |
| 7,778,089 B2 * | 8/2010 | Shin et al. | 365/189.05 |
| 7,995,411 B2 | 8/2011 | Wilson et al. | |
| 2004/0130353 A1 | 7/2004 | Nautiyal et al. | |

FOREIGN PATENT DOCUMENTS

| | | |
|---|---|---|
| JP | 58218677 A | 12/1983 |
| JP | 2007080415 A | 3/2007 |
| JP | 2007149222 A | 6/2007 |
| KR | 20040093897 A | 11/2004 |

OTHER PUBLICATIONS

B. Nikolic et al., "Sense Amplifier-Based Flip-Flop," IEEE International Solid-State Circuits Conference (ISSCC), Digest of Technical Papers, Session 16, Paper TP 16.5, Feb. 1999, 3 pages.

T. Kobayashi et al., "A Current-Controlled Latch Sense Amplifier and a Static Power-Saving Input Buffer for Low-Power Architecture," IEEE Journal of Solid-State Circuits, Apr. 1993, pp. 523-527, vol. 28, No. 4.

H. Wang et al., "A Low Power Current Sensing Scheme for CMOS SRAM," IEEE International Workshop on Memory Technology, Design and Testing (MTDT), 1996, pp. 37-45.

* cited by examiner

*Primary Examiner* — David Lam
(74) *Attorney, Agent, or Firm* — Ryan, Mason & Lewis, LLP

(57) ABSTRACT

A memory device includes a memory array comprising a plurality of memory cells arranged in rows and columns, and sensing circuitry coupled to bitlines associated with respective columns of the memory cells of the memory array. The sensing circuitry comprises, for at least a given one of the bitlines of the memory array, a sense amplifier configured to sense data on the given bitline, with the sense amplifier having at least one internal node and at least one output node. The sensing circuitry further comprises a latch circuit having a data input coupled to the output node and a control input coupled to the internal node, with the latch circuit being configured to latch sensed data from the output node responsive to a signal at the internal node.

23 Claims, 4 Drawing Sheets

MEMORY DEVICE HAVING SENSING CIRCUITRY WITH AUTOMATIC LATCHING OF SENSE AMPLIFIER OUTPUT NODE

BACKGROUND

A semiconductor memory device typically includes an array of memory cells arranged in rows and columns, with each memory cell configured to store a data bit. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into a precharge phase and an active phase, with the precharge phase being used to precharge the bitlines to a precharge voltage, and the active phase being used to read or write one or more memory cells of the array. Reading a given memory cell generally comprises transferring data stored within that cell to its corresponding bitline, and writing a given memory cell generally comprises transferring data into that cell from its corresponding bitline.

Memory cell access time is becoming an increasingly important issue in memory device design. For example, excessive memory cell access times can lead to performance bottlenecks in high speed processors. Conventional approaches to reading data from a memory cell include the use of differential balanced sense amplifiers or single-ended unbalanced sense amplifiers. In a typical conventional arrangement, a given sense amplifier output node is coupled to a latch. For each read memory cycle, the sense amplifier is turned on in order to sense data on a corresponding bitline, and then turned off once the sensed data at its output node is stored in the latch, responsive to a sense amplifier enable signal.

Operation of the latch generally requires a separate latch control signal. In order to establish proper timing between the sense amplifier enable signal and the separate latch control signal, it is often necessary for inverters or other circuitry to be inserted at the control input of the latch. Also, it can be very difficult to maintain the appropriate timing margins over process, voltage and temperature (PVT) variations. Moreover, transistor mismatch may require that multiple additional inverters be inserted between an internal node of the sense amplifier and its output node. Accordingly, the significant amounts of additional circuitry required for each sense amplifier and its associated latch in order to address the above-noted signal timing and transistor mismatch concerns can unduly increase the required circuit area and power consumption of the memory device, particularly in view of the large number of sense amplifiers usually present in a given such device. In addition, signal delays attributable to the inclusion of additional inverters and other circuitry can lead to longer memory cell access times.

SUMMARY

Illustrative embodiments of the present invention provide sensing circuitry in which sensed data at a sense amplifier output node is automatically stored in a latch, utilizing a signal from an internal node of the sense amplifier. This avoids the need for a separate latch control signal, as well the associated inverters or other circuitry typically used to establish proper timing between such a separate latch signal and a sense amplifier enable signal. Also, it is no longer necessary to configure the sensing circuitry to maintain timing margins between the latch control signal and the sense amplifier enable signal over PVT variations, as the design is essentially margin-free. In addition, this automatic latching arrangement serves to alleviate the transistor mismatch concern without requiring the addition of multiple inverters between an internal node of the sense amplifier and its output node.

In one embodiment, a memory device includes a memory array comprising a plurality of memory cells arranged in rows and columns, and sensing circuitry coupled to bitlines associated with respective columns of the memory cells of the memory array. The sensing circuitry comprises, for at least a given one of the bitlines of the memory array, a sense amplifier configured to sense data on the given bitline, with the sense amplifier having at least one internal node and at least one output node. The sensing circuitry further comprises a latch circuit having a data input coupled to the output node and a control input coupled to the internal node, with the latch circuit being configured to latch sensed data from the output node responsive to a signal at the internal node.

For example, the sense amplifier may comprise a differential sense amplifier having first and second internal nodes, and the latch circuit may comprise first and second control inputs coupled to the respective first and second internal nodes, with the latch circuit being configured to latch sensed data from the output node responsive to complementary signals at the first and second internal nodes.

One or more of the illustrative embodiments can provide a memory device that exhibits substantially reduced circuit area and power consumption, as well as improved access time performance.

A memory device in accordance with the invention may be implemented, for example, as a stand-alone memory device, such as a packaged integrated circuit, or as an embedded memory in a microprocessor or other processing device.

DETAILED DESCRIPTION

Embodiments of the invention will be illustrated herein in conjunction with exemplary semiconductor memory devices and associated sensing circuitry. It should be understood, however, that embodiments of the invention are more generally applicable to any semiconductor memory device in which improvements in sensing circuitry area, power and performance are desired, and may be implemented using circuitry other than that specifically shown and described in conjunction with the illustrative embodiments.

Figure 1:
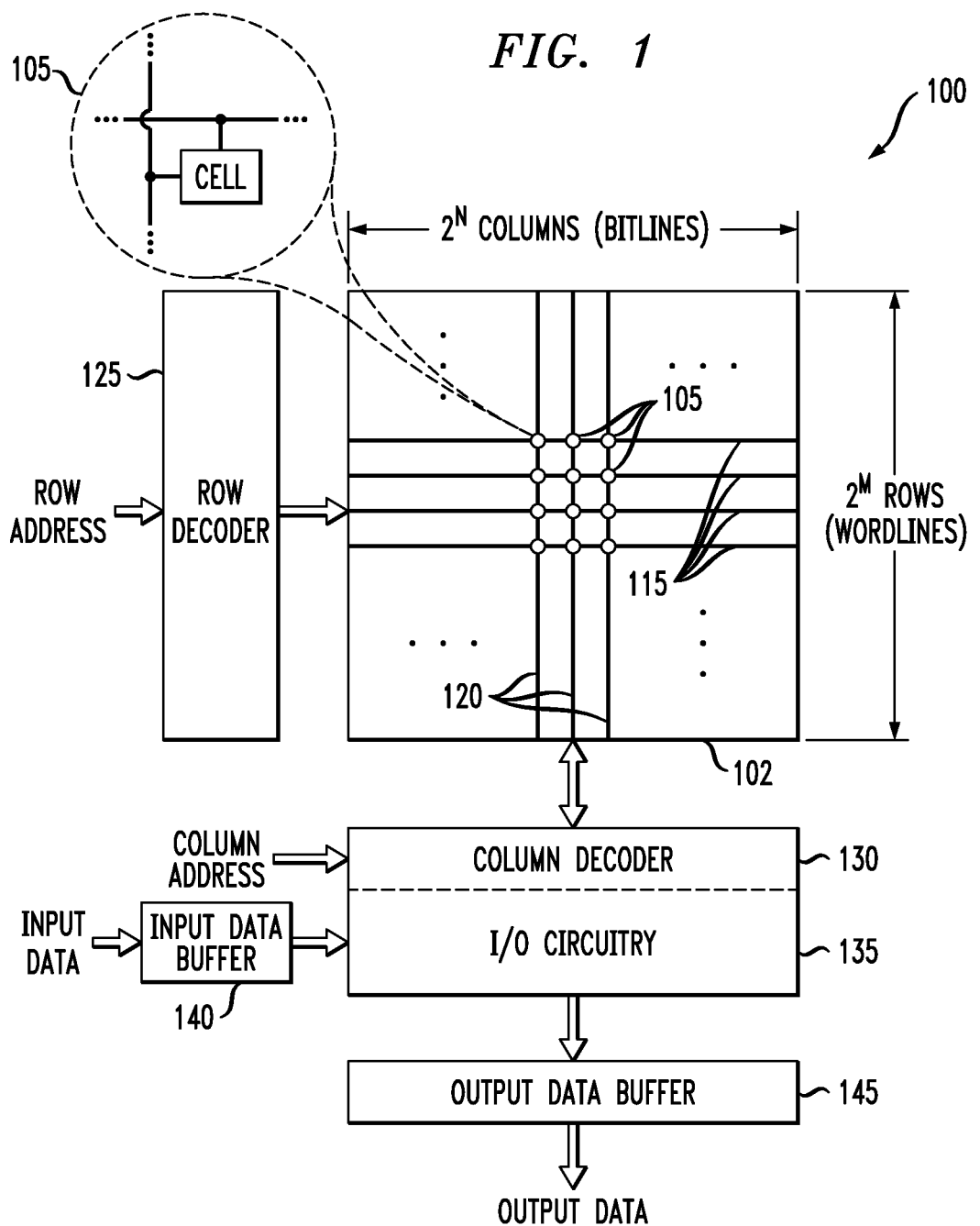
FIG. 1 shows a semiconductor memory device comprising a memory array having a plurality of memory cells and incorporating sensing circuitry with automatic latching of a sense amplifier output node in an illustrative embodiment of the invention.

FIG. 1 shows a simplified diagram of a memory device 100 in accordance with an illustrative embodiment of the invention. The memory device 100 comprises a memory array 102. The memory array 102 comprises a plurality of memory cells 105 each configured to store a single bit of data. Each cell 105 is coupled to a corresponding row or wordline 115 and column or bitline 120. The memory array therefore includes a memory cell at each point where a wordline intersects with a bitline. The memory cells of the memory array are illustratively arranged in $2^N$ columns and $2^M$ rows. The values selected for N and M in a given implementation will generally depend upon on the data storage requirements of the application in which the memory device is utilized.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise sensing circuitry, as will be described in greater detail in conjunction with FIG. 3. The operation of other memory device elements such as row decoder 125, column decoder 130, and buffers 140, 145 is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

The memory device 100 in one or more of the illustrative embodiments may be assumed to comprise a static random access memory (SRAM) device. However, as indicated previously, the disclosed sensing circuitry can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. Embodiments of the invention are therefore not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing the invention.

The present embodiment of memory device 100 is configured to avoid one or more of the drawbacks of conventional practice through the use of sensing circuitry that is illustratively implemented in I/O circuitry 135. As will be described below in conjunction with FIG. 3, the sensing circuitry in this embodiment is configured to provide automatic latching of one or more sense amplifier output nodes, and can provide a significant reduction in the time required to read stored data from the memory cells 105. This access time reduction can be achieved while also reducing circuit area and power consumption in the memory device.

Figure 2:
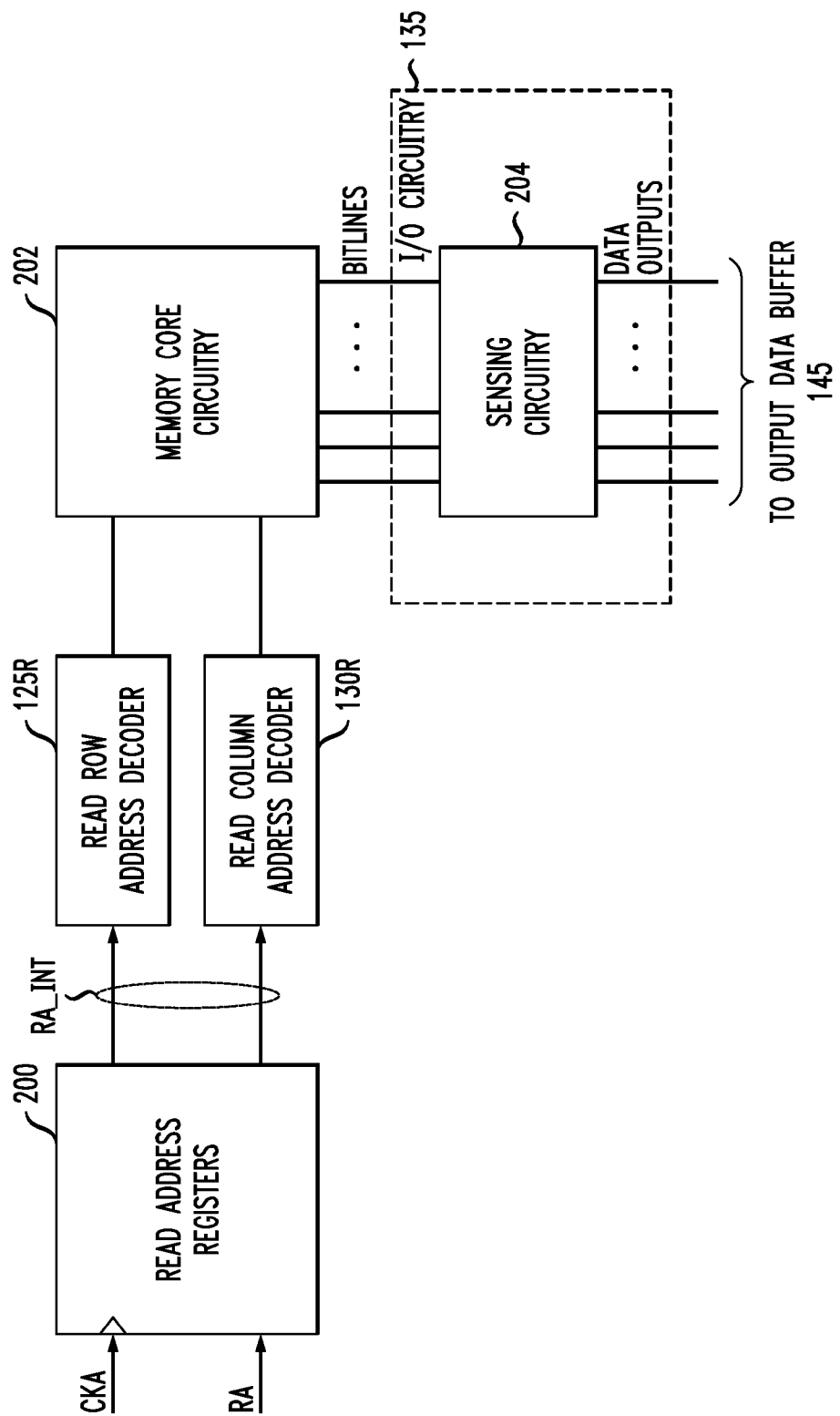
FIG. 2 shows an exemplary read channel in the memory device of FIG. 1.

FIG. 2 shows an exemplary read channel in the memory device 100 of FIG. 1. In the read channel, read address registers 200 receive as inputs a read address (RA) and an address clock (CKA). The address clock CKA may be derived from or correspond to a memory device clock signal. The read address comprises a row address and a column address, collectively designated as RA_INT in FIG. 2. The row and column portions of RA_INT are applied to respective read row address decoder 125R and read column address decoder 130R, which correspond generally to read parts of the respective row and column decoders 125 and 130 of FIG. 1.

Outputs of the read row address decoder 125R are coupled to rows of memory cells 105 of memory core circuitry 202 via respective read wordlines (RWLs). The memory cells 105 of the memory core circuitry 202 are coupled to the I/O circuitry 135 via respective read bitlines (RBLs). The I/O circuitry 135 includes sensing circuitry 204, and may also include additional circuitry not explicitly shown. The sensing circuitry 204 comprises inputs coupled to respective bitlines associated with respective columns of the memory cells 105 of the memory array 102. Data outputs of the sensing circuitry 204 are coupled to corresponding inputs of the output data buffer 145.

In the exemplary read channel as illustrated in FIG. 2, a given RWL may be asserted by read row address decoder 125R responsive to a rising edge of address clock signal CKA, thereby allowing a selected RBL to rise or fall in accordance with the logic level of the data bit stored in the corresponding memory cell 105. It may be assumed, by way of example, that a stored logic '1' bit in a given memory cell 105 will cause the corresponding RBL to rise and a stored logic '0' bit will cause that RBL to fall.

Figure 3:
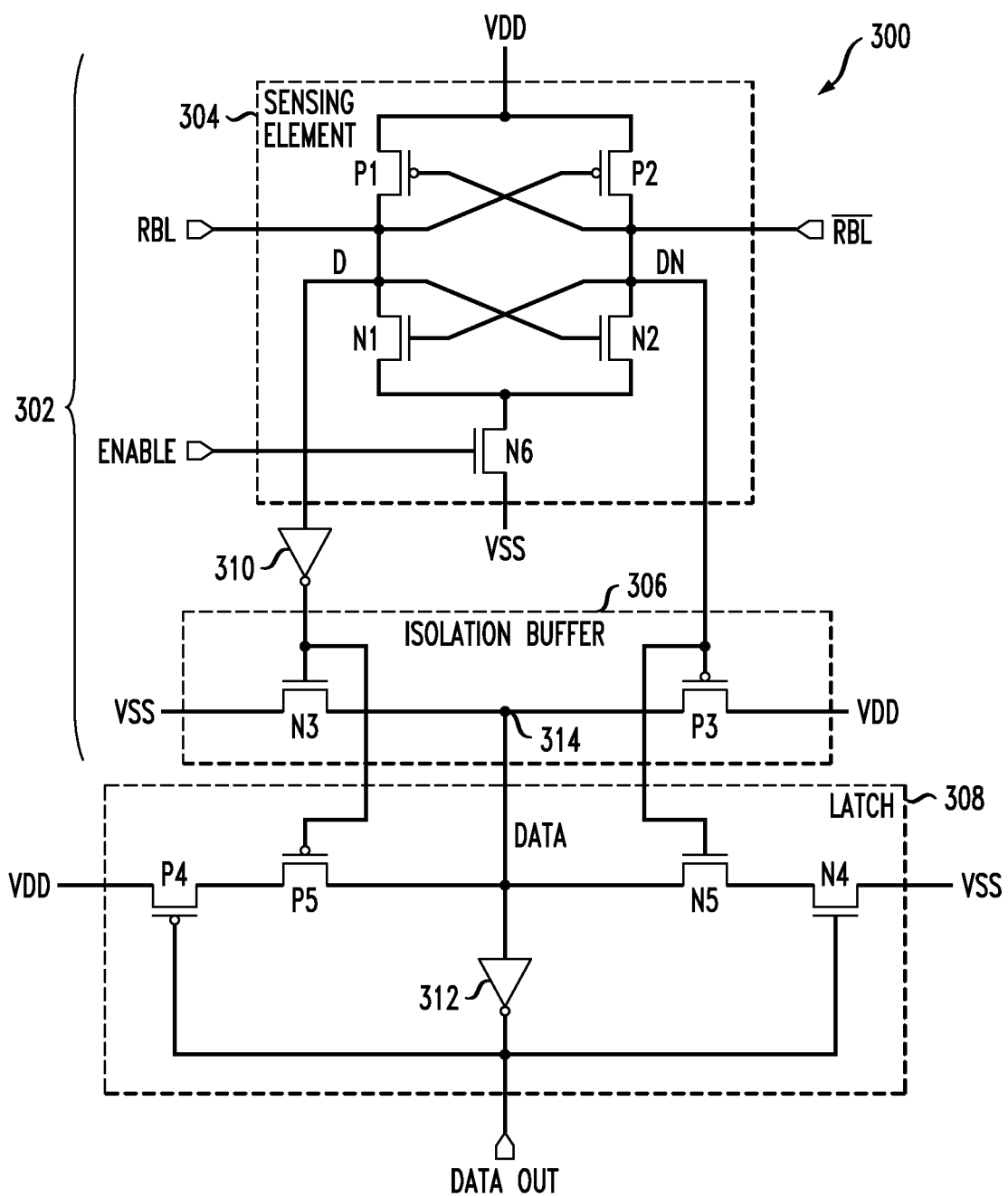
FIG. 3 shows a more detailed view of a portion of the memory device of FIG. 1 illustrating the sensing circuitry associated with a particular bitline.

FIG. 3 shows a more detailed view of sensing circuitry 300 of the memory device 100 in one embodiment. It is to be understood that the sensing circuitry 300 represents a particular portion of the sensing circuitry 204 shown in the FIG. 3 embodiment. More particularly, the sensing circuitry 300 is assumed for purposes of illustration to be associated with a particular RBL of the memory array 102, and thus associated with a corresponding column of memory cells 105 in the memory array. The same or a similar arrangement of sensing circuitry 300 as shown in FIG. 3 will therefore generally be replicated for each of the other RBLs of the memory array 102. However, the term "sensing circuitry" as used herein is intended to be broadly construed so as to encompass arrangements of such circuitry for one bitline or for multiple bitlines.

As illustrated in FIG. 3, the sensing circuitry 300 comprises a sense amplifier 302 configured to sense data on the corresponding RBL. The sense amplifier 302 comprises a sensing element 304 coupled via an isolation buffer 306 to a latch circuit 308. The sense amplifier 302 further comprises an inverter 310 and the latch circuit 308 comprises an inverter 312.

Although the isolation buffer 306 is considered part of the sense amplifier 302 in the present embodiment, in other embodiments this buffer may be considered part of the latch circuit, or part of another memory device component. The term "sense amplifier" as used herein should therefore not be construed as being limited to a sense amplifier that includes an isolation buffer.

The sense amplifier 302 in the present embodiment is a differential sense amplifier having first and second internal nodes denoted D and DN, which are coupled to RBL and its complement, respectively. The latch circuit 308 has a data input coupled to an output node 314 of the sense amplifier 302, and control inputs coupled to the respective first and second internal nodes D and DN. The latch circuit 308 is configured to latch sensed data from the output node 314 responsive to complementary signals developed at the first and second internal nodes D and DN and applied to its respective control inputs. It is to be appreciated that the node 314 is only one example of a sense amplifier output node, and other circuit nodes may be considered sense amplifier output nodes in this embodiment or other embodiments. The term "output node" is therefore intended to be broadly construed herein. Similarly, the term "internal node" as used herein is also intended to be broadly construed.

The sensing element 304 comprises pairs of cross-coupled transistors having their gates coupled to respective ones of the first and second internal nodes D and DN. More particularly, in this embodiment the sensing element 304 comprises a pair of cross-coupled p-type metal-oxide-semiconductor (PMOS) transistors P1 and P2, with the gates of P2 and P1 being coupled to respective ones of the first and second internal nodes D and DN, and a pair of cross-coupled n-type metal-oxide-semiconductor (NMOS) transistors N1 and N2, with the gates of N2 and N1 being coupled to respective ones of the first and second internal nodes D and DN.

Additional PMOS and NMOS transistors in the FIG. 3 embodiment include transistors N3 and P3 in the isolation buffer 306, transistors P4, P5, N4 and N5 in the latch circuit 308, and transistor N6 in the sensing element 304. The transistors P4 and N4 are also referred to herein as latch feedback transistors.

The transistor N6 in the sensing element 304 is configured to enable the sensing element 304 to sense data at the first and second internal nodes D and DN responsive to an enable signal. The transistor N6 is an example of what is more generally referred to herein as "control circuitry" of the sensing element. In this example, the gate of N6 is adapted to receive the enable signal, its drain is coupled to the sources of N1 and N2, and its source is coupled to a lower voltage supply line, illustratively VSS. A variety of other types of control circuitry may be used to control enabling of the sensing element 304 in other embodiments, as will be readily apparent to those skilled in the art.

Referring again to the pairs of cross-coupled transistors P1-P2 and N1-N2 in the sensing element 304, the source of P1 is coupled to the upper voltage supply line, illustratively VDD, and its drain is coupled to the first internal node D. The source of P2 is coupled to VDD, and its drain is coupled to the second internal node DN. The source of N1 is coupled to VSS, via the control circuitry transistor N6, and its drain is coupled to the first internal node D. The source of N2 is coupled to VSS via the control circuitry transistor N6, and its drain is coupled to the second internal node DN.

The isolation buffer 306 is coupled between the first and second internal nodes D and DN and the output node 314 of the sense amplifier 302. More particularly, isolation buffer 306 in this embodiment comprises transistor N3 having its gate coupled to the first internal node D via inverter 310, and transistor P3 having its gate coupled to the second internal node DN. The drains of transistors N3 and P3 are coupled together at the sense amplifier output node 314, and their sources are coupled to VSS and VDD, respectively.

In the latch circuit 308, transistors P4 and N4 have their gates coupled to the data output of the latch circuit, which corresponds to the output of inverter 312. The inverter 312 is coupled between the output node 314 of the sense amplifier 302 and the data output of the latch circuit. Transistors P5 and N5 of latch circuit 308 have their respective gates coupled to the first and second internal nodes D and DN of the sense amplifier 302, with the gate of P5 being coupled to first internal node D via inverter 310. Transistor P5 has its source coupled to VDD via transistor P4 and its drain coupled to the output node 314 of the sense amplifier 302. Similarly, transistor N5 has its source coupled to VSS via transistor N4 and its drain coupled to the output node 314 of the sense amplifier 302.

The operation of the sensing circuitry 300 is as follows. For each read cycle, the sense amplifier 302 is first enabled in order to sense data on RBL and then disabled after the sensed data is latched in the latch circuit 308. Prior to the start of a current read cycle, and more specifically at the end of the previous read cycle, the enable signal is at a logic low level and transistor N6 is off, such that sensing element 304 is disabled. At this point the internal nodes D and DN are precharged to a logic high level. At the start of the current read cycle, the enable signal transitions to a logic high level, turning transistor N6 on and enabling the sensing element 304 such that the internal nodes D and DN sense the data on RBL and its complement, respectively. One of the internal nodes D or DN of the sense amplifier 302 will transition from a logic high level to a logic low level depending on whether the sensed data is at a logic high level or a logic low level.

Assume by way of example that the latch circuit 308 is storing a logic high bit from a previous read cycle when the current read cycle is initiated. Accordingly, transistor P5 is on at that point. If the sensed data in the current read cycle is at a logic low level, internal node D will transition to a logic low level while internal node DN remains at a logic high level, such that P3 is off. The output of inverter 310 is at a logic high level, which turns on N3 and turns off P5. As a result, output node 314 goes to a logic low level and that data state is captured by the latch circuit 308.

The fact that P5 is off at this time ensures that N3 does not have to fight the latch feedback PMOS transistor P4 in changing the latched data from a logic high level to a logic low level. Similarly, when the sense amplifier 302 is reading a logic high level from RBL in the current read cycle, and assuming storage of a logic low level in the latch circuit 308 in the previous read cycle, internal node DN will be low such that P3 is on and N5 is off, and as a result P3 does not have to fight the latch feedback NMOS transistor N4 in changing the latched data from a logic low level to a logic high level.

The sensing circuitry 300 in the present embodiment is configured such that the loads on the respective internal nodes D and DN are substantially matched. Such matching is not difficult in this embodiment because node DN is driving both P3 and N5, which facilitates load matching with the input of inverter 310 as seen by node D. Thus, P3 and N5 can be sized similarly to the respective PMOS and NMOS transistors of inverter 310, thereby ensuring that both internal nodes D and DN see substantially the same load. Other features of the physical layout of transistors P3 and N5 may also be made similar to those of the respective PMOS and NMOS transistors of inverter 310 in order to help ensure proper matching.

In the sensing circuitry 300, sensed data at sense amplifier output node 314 is automatically stored in latch circuit 308, utilizing as control signals the signals from the respective first and second internal nodes D and DN of the sense amplifier 302. The term "automatic" in this context refers to latching of the sensed data without the need for application of a separate control signal to the latch circuit. Accordingly, the sensing circuitry 300 avoids the conventional need for a separate latch control signal, as well the associated inverters or other circuitry typically used to establish proper timing between such a separate latch control signal and a sense amplifier enable signal.

In addition, the need to configure sensing circuitry to maintain timing margins between the latch control signal and the sense amplifier enable signal over PVT variations is entirely avoided, leading to a margin-free design.

The automatic latching arrangement also alleviates the above-noted transistor mismatch concern without requiring the addition of multiple inverters between an internal node of the sense amplifier and its output node. As a result, the memory device 100 exhibits substantially reduced circuit area and power consumption, as well as improved access time performance.

Moreover, sensing circuitry with automatic leaching of sense amplifier output therefore provides an essentially "risk-free" latching arrangement that scales easily with technology and performance requirements, leading to increased yield in the memory device manufacturing process.

It is to be appreciated that the particular sensing circuitry 300 shown in the embodiment of FIG. 3 is presented by way of illustration only, and a wide variety of other types of sense amplifier and latch circuit configurations may be utilized in implementing other embodiments of the present invention. For example, in one or more of these other embodiments, the conductivity types of at least a subset of the PMOS and NMOS transistors of the sensing circuitry 300 may be reversed, and other suitable modifications may be made to the circuitry, as would be appreciated by one skilled in the art. As another example, other types of latch circuits may be used, such as a set-reset latch with NAND gates connected back-to-back, although such an arrangement may result in additional delay and therefore degraded performance relative to the FIG. 3 circuitry arrangement.

A given memory device configured in accordance with an embodiment of the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 4:
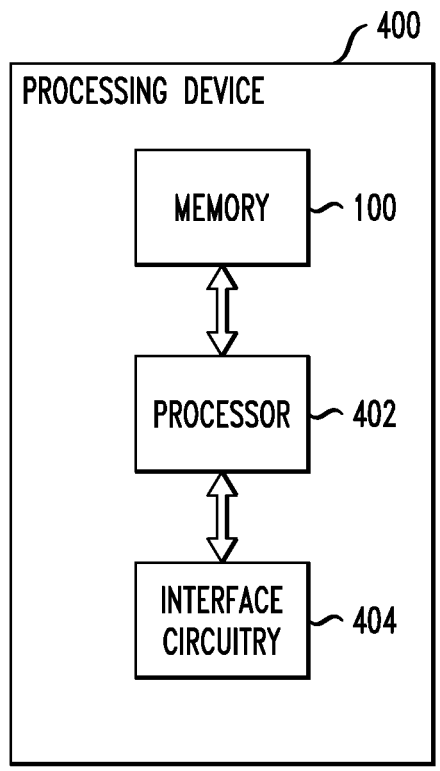
FIG. 4 is a block diagram of a processing device which incorporates the memory device of FIG. 1.

FIG. 4 shows an embodiment of a processing device 400 which incorporates the memory device 100 of FIG. 1. In this embodiment, the memory device 100 is coupled to a processor 402. The processing device further includes interface circuitry 404 coupled to the processor 402. The processing device 400 may comprise, for example, a computer, a server or a portable communication device such as a mobile telephone. The interface circuitry 404 may comprise one or more transceivers for allowing the device 400 to communicate over a network.

Figure 5:
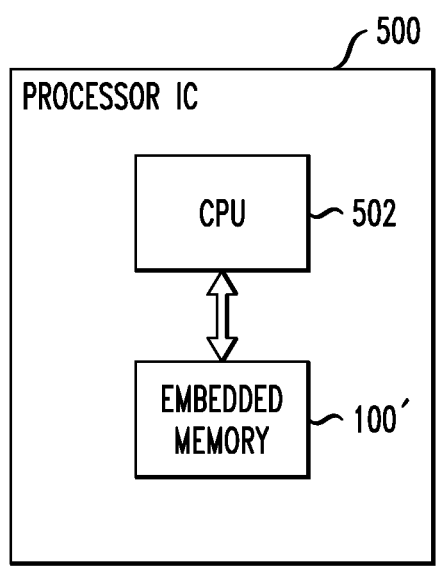
FIG. 5 is a block diagram of a processor integrated circuit which incorporates the memory device of FIG. 1 as an embedded memory.

Alternatively, processing device 400 may comprise a microprocessor, DSP or ASIC, with processor 402 corresponding to a central processing unit (CPU) and memory device 100 providing at least a portion of an embedded memory of the microprocessor, DSP or ASIC. FIG. 5 shows an example of an arrangement of this type, with processor integrated circuit 500 incorporating the memory device of FIG. 1 as an embedded memory 100'. The embedded memory 100' in this embodiment is coupled to a CPU 502. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with sensing circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, memory cell circuitry, sensing circuitry, transistor conductivity types, control signals, and other elements for implementing the described functionality. These and numerous other alternative embodiments within the scope of the following claims will be apparent to those skilled in the art.

What is claimed is:

1. A memory device comprising:
    a memory array comprising a plurality of memory cells arranged in rows and columns; and
    sensing circuitry coupled to bitlines associated with respective columns of the memory cells of the memory array;
    the sensing circuitry comprising for at least a given one of the bitlines:
    a sense amplifier configured to sense data on the given bitline and having at least one internal node and at least one output node; and
    a latch circuit having a data input coupled to the output node and a control input coupled to the internal node;
    wherein the latch circuit is configured to latch sensed data from the output node responsive to a signal at the internal node.

2. The memory device of claim 1 wherein the sense amplifier comprises first and second internal nodes, and the latch circuit comprises first and second control inputs coupled to the respective first and second internal nodes, and wherein the latch circuit is configured to latch sensed data from the output node responsive to complementary signals at the first and second internal nodes.

3. The memory device of claim 2 wherein the first and second internal nodes are associated with a sensing element of the sense amplifier.

4. The memory device of claim 3 wherein the sensing element comprises at least one pair of cross-coupled transistors having their gates coupled to respective ones of the first and second internal nodes.

5. The memory device of claim 4 wherein the sensing element comprises:
    a first pair of cross-coupled transistors of a first conductivity type with their gates coupled to respective ones of the first and second internal nodes;
    a second pair of cross-coupled transistors of a second conductivity type with their gates coupled to respective ones of the first and second internal nodes; and
    control circuitry configured to enable the sensing element to sense data at the first and second internal nodes responsive to an enable signal.

6. The memory device of claim 5 wherein the first pair of cross-coupled transistors comprises first and second p-type field effect transistors, with the first p-type field effect transistor having its gate coupled to the second internal node, its source coupled to an upper voltage supply line, and its drain coupled to the first internal node, and with the second p-type field effect transistor having its gate coupled to the first internal node, its source coupled to the upper voltage supply line, and its drain coupled to the second internal node.

7. The memory device of claim 5 wherein the second pair of cross-coupled transistors comprises first and second n-type field effect transistors, with the first n-type field effect transistor having its gate coupled to the second internal node, its source coupled to a lower voltage supply line via the control circuitry, and its drain coupled to the first internal node, and with the second n-type field effect transistor having its gate coupled to the first internal node, its source coupled to the lower voltage supply line via the control circuitry, and its drain coupled to the second internal node.

8. The memory device of claim 5 wherein the control circuitry comprises a field effect transistor having its gate adapted to receive the enable signal, one of its source and drain coupled to a voltage supply line and the other of its source and drain coupled to source or drain terminals of one of the pairs of cross-coupled transistors.

9. The memory device of claim 2 wherein the sense amplifier further comprises an isolation buffer coupled between the first and second internal nodes and the output node of the sense amplifier.

10. The memory device of claim 9 wherein the isolation buffer comprises:
a first transistor of a first conductivity type having its gate coupled to the first internal node; and
a second transistor of a second conductivity type having its gate coupled to the second internal node;
wherein a source or drain of the first transistor is coupled to a source or drain of the second transistor at the output node of the sense amplifier.

11. The memory device of 10 wherein one of the first and second transistors has its gate coupled to the corresponding internal node via an inverter.

12. The memory device of claim 1 wherein the latch circuit comprises:
first and second transistors of respective first and second conductivity types having gates coupled to first and second internal nodes of the sense amplifier;
third and fourth transistors of respective first and second conductivity types having gates coupled to an output of the latch circuit; and
an inverter coupled between the output node of the sense amplifier and the output of the latch circuit;
wherein the first transistor has one of its source and drain coupled to one of a source and drain of the third transistor and the other of its source and drain coupled to the output node of the sense amplifier; and
wherein the second transistor has one of its source and drain coupled to one of a source and drain of the fourth transistor and the other of its source and drain coupled to the output node of the sense amplifier.

13. The memory device of claim 12 wherein one of the first and second transistors has its gate coupled to the corresponding first or second internal node via an inverter.

14. An integrated circuit comprising the memory device of claim 1.

15. A processing device comprising the memory device of claim 1.

16. The memory device of claim 1 wherein a data output of the latch circuit is sent to an input of an output data buffer.

17. The memory device of claim 1 wherein the latch circuit is configured to latch the sensed data from the output node responsive to signals from one or more internal nodes without additional control signals.

18. The memory device of claim 1 wherein the latch circuit is configured to latch the sensed data from the output node responsive to the signal at the internal node during reading of a memory cell.

19. An apparatus comprising:
a sense amplifier configured to sense data on a bitline of a memory array and having at least one internal node and at least one output node; and
a latch circuit having a data input coupled to the output node and a control input coupled to the internal node;
wherein the latch circuit is configured to latch sensed data from the output node responsive to a signal at the internal node.

20. The apparatus of claim 19 wherein the sense amplifier comprises first and second internal nodes, and the latch circuit comprises first and second control inputs coupled to the respective first and second internal nodes, and wherein the latch circuit is configured to latch sensed data from the output node responsive to complementary signals at the first and second internal nodes.

21. The apparatus of claim 19 wherein the latch circuit comprises:
first and second transistors of respective first and second conductivity types having gates coupled to first and second internal nodes of the sense amplifier;
third and fourth transistors of respective first and second conductivity types having gates coupled to an output of the latch circuit; and
an inverter coupled between the output node of the sense amplifier and the output of the latch circuit;
wherein the first transistor has one of its source and drain coupled to one of a source and drain of the third transistor and the other of its source and drain coupled to the output node of the sense amplifier; and
wherein the second transistor has one of its source and drain coupled to one of a source and drain of the fourth transistor and the other of its source and drain coupled to the output node of the sense amplifier.

22. A method comprising:
sensing data on a bitline of a memory array in a sense amplifier; and
latching sensed data from an output node of the sense amplifier responsive to a signal at an internal node of the sense amplifier.

23. The method of claim 22 wherein the latching step comprises latching sensed data from the output node of the sense amplifier responsive to complementary signals at first and second internal nodes of the sense amplifier.

* * * * *